US007206173B2

United States Patent
Mizuguchi

(10) Patent No.: US 7,206,173 B2
(45) Date of Patent: Apr. 17, 2007

(54) MAGNETORESISTIVE-EFFECT ELEMENT HAVING A PROMINENT MAGNETORESISTIVE EFFECT, AND METHOD OF MANUFACTURING SAME

(75) Inventor: Tetsuya Mizuguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 466 days.

(21) Appl. No.: 09/822,934

(22) Filed: Mar. 30, 2001

(65) Prior Publication Data

US 2001/0033463 A1 Oct. 25, 2001

(30) Foreign Application Priority Data

Mar. 30, 2000 (JP) ............... P2000-097944

(51) Int. Cl.
G11B 5/33 (2006.01)

(52) U.S. Cl. ..................................... 360/324

(58) Field of Classification Search ............... 360/324, 360/324.1, 324.11, 324.12
See application file for complete search history.

(56) References Cited

U.S. PATENT DOCUMENTS

| 6,219,208 B1* | 4/2001 | Gill ................. 360/324.1 |
| 6,452,761 B1* | 9/2002 | Carey et al. ........... 360/320 |
| 6,535,362 B2* | 3/2003 | Kawawake et al. ...... 360/324.1 |
| 6,654,211 B2* | 11/2003 | Gill et al. ........... 360/324.12 |
| 6,693,776 B2* | 2/2004 | Gill ................. 360/324.12 |

* cited by examiner

*Primary Examiner*—David Davis
(74) *Attorney, Agent, or Firm*—Sonnenschein Nath & Rosenthal LLP

(57) ABSTRACT

A magnetoresistance-effect element comprising a magnetism-sensing layer 9, a low-resistance metal layer 10 and an oxide layer 11. The magnetism-sensing layer 9 has its electric resistance changed in accordance with an external magnetic field. The low-resistance metal layer 9 is formed in contact with the magnetism-sensing layer 9. The oxide layer 11 is provided on that surface of the metal layer 10 which faces away from the magnetism-sensing layer 9.

10 Claims, 5 Drawing Sheets

MAGNETORESISTIVE-EFFECT ELEMENT HAVING A PROMINENT MAGNETORESISTIVE EFFECT, AND METHOD OF MANUFACTURING SAME

BACKGROUND OF THE INVENTION

The present invention relates to magnetoresistance-effect element having a prominent magnetoresistance effect, a magnetoresistance-effect magnetic head incorporating this element, and a method of manufacturing the magnetoresistance-effect element.

Magnetoresistance-effect magnetic heads (hereinafter referred to as "MR heads") that incorporate a magnetoresistance-effect element (hereinafter referred to as "MR element") have been in common use. Each magnetoresistance-effect magnetic head utilizes the magnetoresistance effect of the MR element, thereby to read signals recorded on magnetic recording media.

An MR element is a kind of a resistance element. Its electric resistance changes as the external magnetic field changes. An MR head has an MR element, whose electric resistance changes with the signal magnetic field emanating from a magnetic recording medium. Utilizing the change in the electric resistance of the MR element, the MR head reads the signals magnetically recorded on the magnetic recording medium.

In recent years, there has been a demand for a magnetic recording medium that is small and has yet a large storage capacity. To meet this demand, the recording density of magnetic recording media is increased by, for example, narrowing the recording tracks.

On the other hand, MR heads have been improved in order to prevent a decrease in the output signal level that may result from the narrowing of the recording tracks of the media. A notable improvement is the use of an MR thin film having giant magneto-resistivity (GMR) in place of the conventional MR film having anisotropic magneto-resistivity (AMR).

Various MR films exhibiting giant magneto-resistivity are known. Of these MR films, the spin-valve film comprises an anti-ferromagnetic layer, two ferromagnetic layers and a nonmagnetic layer. The nonmagnetic layer is interposed between the two ferromagnetic layers, and the anti-ferromagnetic layer contacts one of the ferromagnetic layer. The ferromagnetic layer contacting the anti-ferromagnetic layer works as a pinned layer. The other ferromagnetic layer functions as a magnetism-sensing layer known as "free layer." The magnetization of the free layer depends on the external magnetic field. The external magnetic field is detected from the different directions in which the pinned layer and free layer are magnetized.

In order to promote changes in the magnetoresistance of the spin-valve film, electrons may be mirror-reflected in the spin-valve film to raise the probability that the electrons scatter themselves depending on their spins.

A spin-valve film is disclosed in, for example, Jpn. Pat. Appln. Laid-Open Publication No. 11-168250 and W. F. Egelhoff et al. (J. Appl. Phys. 82 (12), Dec. 15, 1997. The spin-valve film has an anti-ferromagnetic layer that is made of an oxide. This layer causes mirror reflection of electrons. However, an anti-ferromagnetic layer made of an oxide assumes but insufficient switched connection with the ferromagnetic a ferromagnetic layer that functions as pinned layer. Further, the layer exhibits a lower thermal stability than an anti-ferromagnetic layer made of ordered-form metal and is therefore less reliable.

In order to cause mirror reflection of electrons in a spin-valve film having a commonly used anti-ferromagnetic layer, the magnetic layer that functions as free layer may be oxidized to have a smooth interface, and the smooth interface may be used to cause mirror reflection of electrons. Once oxidized, however, the free layer attains a coercive force and loses soft magnetic property. Consequently, the free layer becomes less sensitive to external magnetic fields.

The rate of changing the magnetoresistance of the spin-valve film may be promoted while preserving the soft magnetic property of the free layer. To this end, an additional layer that causes mirror reflection of electrons may be used. The interface between any two layers mounted one upon the other is rough in terms of an angstrom level. It is quite probable that the spin direction of each electron change as the electron passes through this interface. This lowers the rate of changing the magnetoresistance of the spin-valve film. That is, the additional layer reduces the rate of changing the magnetoresistance of the spin-valve film. Thus, the magnetoresistance of the spin-valve film cannot be changed as much as is expected from the mirror reflection of electrons.

BRIEF SUMMARY OF THE INVENTION

The present invention has been made in view of the foregoing. The first object of the invention is to provide a magnetoresistance-effect element in which the free layer has soft magnetic property and the rate of changing magnetoresistance is increased. The second object of the invention is to provide a magnetoresistance-effect magnetic head incorporating this element and a method of manufacturing the magnetoresistance-effect element.

To achieve the first object mentioned above, a magnetoresistance-effect element according to the invention comprises: a magnetism-sensing section the electric resistance of which changes in accordance with an external magnetic field; a low-resistance metal layer contacting the magnetism-sensing section; and an oxide layer provided on that surface of the low-resistance metal layer which faces away from the magnetism-sensing section.

The magnetoresistance-effect element has an oxide layer that is spaced apart from the magnetism-sensing section and that can cause mirror reflection. The oxide layer prevents oxidation of the magnetism-sensing section and enhances the rate of changing magnetoresistance, while preserving the soft magnetic property of the magnetism-sensing section.

To achieve the second object described above, a magnetoresistance-effect magnetic head according to this invention comprises: a substrate; a pair of magnetic shield members provided on the substrate; a magnetoresistance-effect element interposed between the magnetic shield members; a pair of bias layers provided at the ends of the magnetoresistance-effect element; and a pair of lead electrodes provided in the form of thin film and arranged right above the bias layers. The magnetoresistance-effect element comprises a magnetism-sensing section the electric resistance of which changes in accordance with an external magnetic field, a low-resistance metal layer contacting the magnetism-sensing section, and an oxide layer provided on that surface of the low-resistance metal layer which faces away from the magnetism-sensing section.

The magnetoresistance-effect magnetic head has a magnetoresistance-effect element that exhibits high rate of changing magnetoresistance, while preserving soft magnetic property. Therefore, the magnetoresistance-effect magnetic head can have high sensitivity to external magnetic fields and reproduce high-level signals from magnetic fields.

To achieve the second object described above, there is provided a method designed to manufacture a magnetoresistance-effect element that has a magnetism-sensing section the electric resistance of which changes in accordance with an external magnetic field. The method comprises: a first step of forming the magnetism-sensing section and a low-resistance metal layer on a substrate, in the order mentioned; and a second step of forming an oxide layer by oxidizing that surface of the low-resistance metal layer which faces away from the magnetism-sensing section.

In the method of manufacturing a magnetoresistance-effect element, that surface of the low-resistance metal layer which faces away from the magnetism-sensing section is oxidized, forming the oxide layer. Hence, the interface between the low-resistance metal layer and the oxide layer can be extremely smooth.

It is desired that a protective layer be formed on the low-resistance metal layer in the first step, and that surface of the low-resistance metal which faces away from the magnetism-sensing section be oxidized in the second step, by applying oxygen through the protective layer. This prevents the low-resistance metal layer from being oxidized to excess.

To achieve the second object of the invention, there is provided a method of manufacturing a magnetoresistance-effect element having a magnetism-sensing section the electric resistance of which changes in accordance with an external magnetic field. The method comprises: a first step of forming a low-resistance metal layer and the magnetism-sensing section on a substrate, in the order mentioned; and a second step of forming an oxide layer by oxidizing that surface of the low-resistance metal layer which faces away from the magnetism-sensing section.

In this method, that surface of the low-resistance metal layer which faces away from the magnetism-sensing layer is oxidized, thus forming the oxide layer. The interface between the low-resistance metal layer and the oxide layer can therefore be extremely smooth.

As can be understood from the foregoing, the magnetoresistance-effect element according to the present invention has an oxide layer which is spaced apart from the magnetism-sensing layer and which can cause mirror reflection. The interface between the low-resistance metal layer and the oxide layer is extremely smooth. This prevents most electrons passing through the interface from having their spin directions changed. Thus, no additional layers need to be provided, and the rate of changing magnetoresistance would not decrease. It is therefore possible to enhance the rate of changing magnetoresistance to maximum, by virtue of the mirror reflection, while preserving the soft magnetic property of the magnetism-sensing section. Hence, the magnetoresistance-effect element of the invention can attain both good soft magnetic property and high rate of changing magnetoresistance.

As is clear from the above, the magnetoresistance-effect magnetic head of the present invention has a magnetoresistance-effect element that exhibits high sensitivity to external magnetic fields and high rate of changing magnetoresistance. Therefore, the magnetic head is very sensitive to the magnetic field emanating from magnetic recording media and reproduce high-level signals from a magnetic field. The magnetic head is suitable for reproducing signals recorded at high density.

In the method of manufacturing a magnetoresistance element, according to the present invention, an oxide layer is formed by oxidizing that surface of the low-resistance metal layer which faces away from the magnetism-sensing section. That is, the oxide layer is formed by processing the low-resistance metal layer. The interface between the low-resistance metal layer and the oxide layer can therefore be very smooth. Thus, the method can provide a magnetoresistance element in which the rate of changing magnetoresistance increases to maximum by virtue of mirror reflection and no loss of the rate is caused by changes in the spin directions of electrons. In particular, the protective layer prevents the low-resistance metal layer from being oxidized to excess. The method of the invention can, therefore, manufacture a magnetoresistance-effect element that exhibits high rate of changing magnetoresistance, while preserving soft magnetic property.

DETAILED DESCRIPTION OF THE INVENTION

Figure 1:
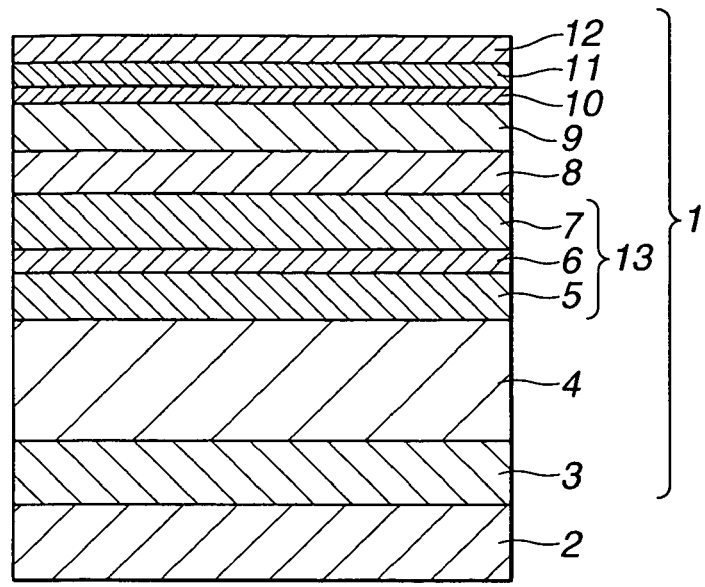
FIG. 1 is a sectional view of a spin-valve film of so-called "bottom type," according to the present invention.

Embodiments of a magnetoresistance-effect element, a magnetoresistance-effect magnetic head incorporating the element and a method of manufacturing the magnetoresistance-effect element, all according to the invention, will be described, with reference to the accompanying drawings.

In the drawings, some parts of the embodiments are magnified to illustrate the characterizing features of the invention. Thus, the dimensional ratio among the parts of the same embodiment, which are shown in the drawings, may differ from the actual dimensional ratio.

In the following description, the structure and material of each layer of a magnetoresistance-effect element will be specified. The present invention is not limited to the element, and the structure and material are therefore nothing more than examples. Each layer may have any other structure and may be made of any other material, in accordance with the object and function that the layer should achieve and perform.

A bottom type, spin-valve film, i.e., a component of the magnetoresistance-effect element according to the invention, will be described with reference to FIG. 1. As shown in FIG. 1, the spin-valve film 1 comprises a substrate 2, a primary-coat layer 3, an anti-ferromagnetic layer 4, a first ferromagnetic layer 5, a first nonmagnetic layer 6, a second ferromagnetic layer 7, a nonmagnetic metal layer 8, a magnetism-sensing (free) layer 9, a low-resistance metal layer 10, an oxide layer 11, and a protective layer 12. The layers 2 to 12 are provided on the substrate 2, laid one upon another in the order they are mentioned. The first ferromagnetic layer 5, first nonmagnetic layer 6 and second ferromagnetic layer 7 constitute a pinned layer 13.

The substrate 2 is made of, for example, a nonmagnetic, nonconductive material such as glass.

The primary-coat layer 3 is made of, for example, a nonmagnetic, nonconductive material such as Ta. Having the primary-coat layer 3, the spin-valve film 1 attains good crystal orientation. In addition, the primary-coat layer 3 inhibits the material of the substrate 2 from contaminating the thin layers constituting the spin-valve film 1.

The anti-ferromagnetic layer 4 is made of a non-ordered-form, anti-ferromagnetic material containing Mn, such as Pt—Mn alloy, Ni—Mn alloy, Pd—Pt—Mn alloy or the like. Alternatively, the layer 4 may be made of NiO, á-$Fe_2O_3$ or the like. The anti-ferromagnetic film 4 sets the direction in which the first and second ferromagnetic layers 5 and 7 are magnetized. As mentioned above, the first ferromagnetic layer 5 and the second ferromagnetic layer 7 constitute the pinned layer 13, which will be described later.

The first ferromagnetic layer and the second ferromagnetic layer 7 are made of, for example, magnetic material such as Ni—Fe alloy or alloy containing Co, Ni or Fe. The ferromagnetic layers 5 and 7 constitute the pinned layer 13, along with the first nonmagnetic layer 66. The pinned layer 13 has a so-called "laminated ferri-structure." The ferromagnetic layers 5 and 7 are set in switched connection with the anti-ferromagnetic layer 4 so that they may be magnetized in a specific direction.

Having the laminated ferri-structure, the pinned layer 13 attains a small magnetic moment. Therefore, a small anti-magnetic field is applied to the free layer 9. The laminated ferri-structure comprises the two ferromagnetic layers 5 and 7 and the first nonmagnetic layer 6 interposed between the layers 5 and 7. The thickness of the first nonmagnetic layer 6 is adjusted, whereby the first and second ferromagnetic layers 5 and 7 are coupled and set anti-parallel to each other in terms of direction of magnetization. The first nonmagnetic layer 6, i.e., the intermediate layer of the laminated ferri-structure, is made of, for example, Ru, Rh, Ir, Re or the like.

The nonmagnetic metal layer 8 is made of electrically conducive, nonmagnetic material such as Cu, Cu—Ni alloy or the like. Thanks to the nonmagnetic layer 8, the spin-valve film 1 achieves a prominent magnetoresistance effect.

The magnetism-sensing layer 9 is made of magnetic material that exhibits good soft magnetic property. The layer 9 is a so-called "free layer," whose direction of magnetization changes in accordance with the external magnetic field. The layer 9 may be a laminated layer composed of, for example, a Ni—Fe alloy layer and a Co—Fe alloy layer. In this case, the magnetism-sensing layer 9 can enhance the sensitivity the spin-valve film 1 has with respect to the signals magnetically recorded on magnetic recording media.

In the spin-valve film 1, the low-resistance metal layer 10 contacts the magnetism-sensing layer 9 that functions as free layer and the oxide layer 11 is provided on that surface of the layer 10 at which the layer 10 contacts the layer 9. That is, the low-resistance metal layer 10 spaces the magnetism-sensing layer 9 apart from the oxide layer 11.

It is desired that the low-resistance metal layer 10 be made mainly of Cu that is a metal having low electric resistance. Preferably, the oxide layer 11 is made mainly of CuO, i.e., an oxide of Cu. The oxide layer 11 has been formed by oxidizing the low-resistance metal layer 10, as will be later described in detail. The oxide layer 11 having been formed by processing the metal layer 10, the layer 10 and the layer 11 fuse together at the interface between them, forming a component of the spin-valve film 1. Hence, the interface between the low-resistance metal layer 10 and the oxide layer 11 is extremely smooth.

Having the oxide layer 11 located near the magnetism-sensing layer 9, the spin-valve film 1 can perform so-called mirror reflection, in which electrons scatter while maintaining their spin directions. When the electrons undergo mirror reflection, the probability of electron scattering that depend on the spin direction of each electron increases greatly. Thus, the rate of changing magnetoresistance can rise in the spin-valve film 1.

The interface between any two adjacent layers constituting the spin-valve film 1 is rough, in terms of an angstrom level. This is why the spin direction of each electron changes when the electron passes through the interface between the layers. Consequently, the rate of changing magnetoresistance decreases. In view of this it seems desirable to arrange the oxide layer 11 adjacent to the magnetism-sensing layer 9 (i.e., free layer), for the purpose of increasing the rate of changing magnetoresistance. If the magnetism-sensing layer 9 and the oxide layer 11 contact each other, however, the oxygen contained in the oxide layer 11 may diffuse into the layer 9, inevitably oxidizing the magnetism-sensing layer 9. Once the layer 9 that function as free layer is oxidized, it loses the soft magnetic property. The direction in which the layer 9 is magnetized can no longer change easily. In other words, the magnetism-sensing layer 9 becomes less sensitive to external magnetic fields. To prevent the oxidation of the layer 9, the low-resistance metal layer 10 is interposed between the magnetism-sensing layer 9 and the oxide layer 11. If the low-resistance metal layer 10 is made of inappropriate material, however, the interface between the metal layer 10 and the oxide layer 11 will be rough. In this case, the spin-valve film 1 may have a low rate of changing magnetoresistance.

In the present embodiment, the low-resistance metal layer 10 is provided in contact with the magnetism-sensing layer 9 and is oxidized at the surface that contacts the layer 9, forming the oxide layer 11. Interposed between the magnetism-sensing layer 9 and the oxide layer 11, the low-resistance metal layer 10 prevents the magnetism-sensing layer 9 from being oxidized. The magnetism-sensing layer 9 can maintain its soft magnetic property. In addition, the loss of the rate of changing magnetoresistance, resulting from the changes in the spin directions of electrons, can be minimized because the interface between the metal layer 10 and the oxide layer 11 is extremely smooth as mentioned above. With the spin-valve film 1 it is therefore possible to increase the rate of changing magnetoresistance to a maximum by virtue of mirror reflection, while preserving the soft magnetic property of the magnetism-sensing layer 9.

As indicated above, it is desired that the low-resistance metal layer 10 be made of Cu. Nonetheless, the metal layer 10 may be made of any other metal material having low electric resistance, such as Au, Ag, Al, Cu alloy, Au alloy, Ag alloy or Al alloy. In this case, the oxide layer 11 is one formed by oxidizing a layer of Au, Ag, Al, Cu alloy, Au alloy, Ag alloy or Al alloy.

The total thickness of the low-resistance metal layer 10 and oxide layer 11 ranges, preferably from 0.5 mm to 2 nm, and more preferably from 0.5 nm to 1.5 nm. If the total thickness of metal layer 10 and oxide layer 11 is less than 0.5 nm, the magnetism-sensing layer 9 that functions as free layer will be oxidized to lose the soft magnetic property. On the other hand, if the total thickness of metal layer 10 and oxide layer 11 exceeds 2 nm, the rate of changing magnetoresistance may fall below the practical use level. If the total thickness of metal layer 10 and oxide layer 11 exceeds 1.5 nm, the rate of changing magnetoresistance starts decreasing and can longer remain at a sufficient value. Therefore, the total thickness of the low-resistance metal layer 10 and oxide layer 11 is set within the range of 0.5 nm to 1.5 nm. The rate of changing magnetoresistance can thereby be enhanced, while preserving the soft magnetic property of the magnetism-sensing layer 9.

It is desired that the protective layer 12 be provided on the oxide layer 11 as is illustrated in FIG. 1. The protective layer 12 is made of nonmagnetic material such as TaO or the like. The protective layer 12 serves to increase the specific resistance of the spin-valve film 1 and stabilize the soft magnetic property of the magnetism-sensing layer 9. Further, the layer 12 can prevent an excessive growth of the oxide film 11, or suppress the oxidation of the metal layer 10, as will be later described in detail, if the low-resistance metal layer 10 is made of copper (Cu) that can be readily oxidized. The magnetism-sensing layer 9 that functions as free layer can, therefore, preserve its soft magnetic property.

In the spin-valve film 1 described above, the pinned layer 13 composed of the first ferromagnetic layer 5, first nonmagnetic layer 6 and second ferromagnetic layer 7 contacts the anti-ferromagnetic layer 4. The pinned layer 13 is therefore magnetized in a certain direction due to the switched-connection force that acts between the spinned layer 13 and the anti-ferromagnetic layer 4. By contrast, the magnetism-sensing layer 9, which that functions as free layer, has its direction of magnetization easily changed by even a weak external magnetic field. This is because the layer 9 is spaced apart from the pinned layer 13 by the nonmagnetic layer 8.

When an external magnetic field is applied to the spin-valve film 1 thus constructed, the direction of magnetization of the free layer is determined by the direction and intensity of the external magnetic field. When the direction of magnetization of the pinned layer 13 is opposite to, or differs by 180° from, the direction of magnetization of the free layer, the electric resistance of the spin-valve film 1 increases to a maximum. When the direction of magnetization of the pinned layer 13 is the same as that of the free layer, the electric resistance of he film 1 falls to a minimum.

That is, the electric resistance of the spin-valve film 1 changes, depending upon the direction and intensity of the external magnetic field applied to the film 1. It follows that the external magnetic field can be detected from the changes in the electric resistance of the spin-valve film 1.

As described above, the spin-valve film 1 has the low-resistance metal layer 10 and the oxide layer 11. The low-resistance metal layer 10 is provided on the magnetism-sensing layer 9 that functions as free layer and made of appropriate material. The oxide layer 11 has been prepared by oxidizing the low-resistance metal layer 10. The magnetism-sensing layer 9 and the oxide layer 11 are spaced apart form each other, by the low-resistance metal layer 10. It is therefore possible to increase the rate of changing magnetoresistance to a maximum by virtue of mirror reflection white preserving the soft magnetic property of magnetism-sensing layer 9. Hence, the spin-valve film 1 can attain both good soft magnetic property and a high rate of changing magnetoresistance.

With the present invention it is possible to cause mirror reflection, no matter whichever material the second ferromagnetic layer 7 is made of. The second ferromagnetic layer 7 can therefore be made of reliable anti-ferromagnetic material. Thus, the spin-valve film 1 can exhibit excellent characteristics.

As related above, the spin-valve film 1 comprises the substrate 2, the primary-coat layer 3, the anti-ferromagnetic layer 4, the pinned layer 13 composed of the first ferromagnetic layer 5, first nonmagnetic layer 6 and second ferromagnetic layer 7, the nonmagnetic metal layer 8, the magnetism-sensing (free) layer 9, the low-resistance metal layer 10, the oxide layer 11, and the protective layer 12, which are laid one upon another in the order mentioned. The present invention is not limited to the spin-valve thus constructed.

Figure 2:
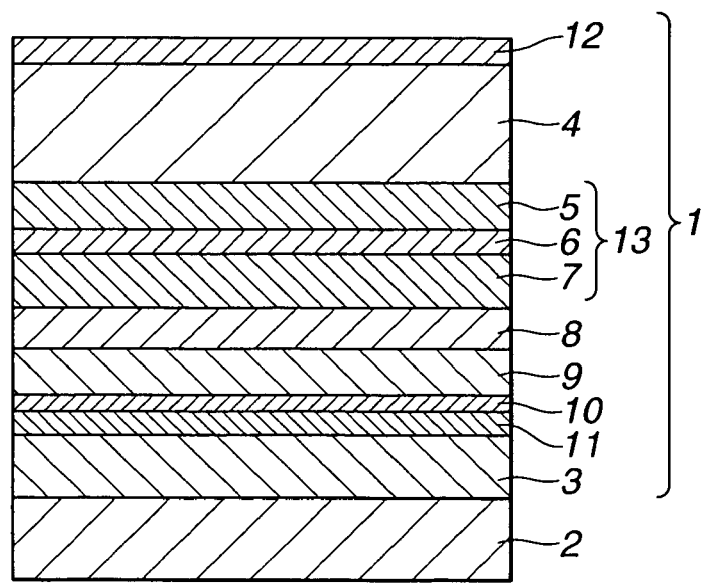
FIG. 2 is a sectional view of a spin-valve film of so-called "top type," according to this invention.

For example, the present invention can provide a so-called top-type spin-valve film, i.e., a magnetoresistance-effect element of another type. FIG. 2 depicts a top-type spin-valve film according to the invention. As shown in FIG. 2, the top type spin-valve film 1 comprises a substrate 2, a primary-coat layer 3, an oxide layer 11, a low-resistance metal layer 10, a magnetism-sensing (free) layer 9, a nonmagnetic metal layer 8, a pinned layer 13 composed of second ferromagnetic layer 7, first nonmagnetic layer 6 and first ferromagnetic layer 5, an anti-ferromagnetic layer 4, and a protective layer 12, which are laid one upon another in the order mentioned. It is desired that the primary-coat layer 3 be made of oxide such as NiO or the like, as will be later explained in detail.

Figure 3:
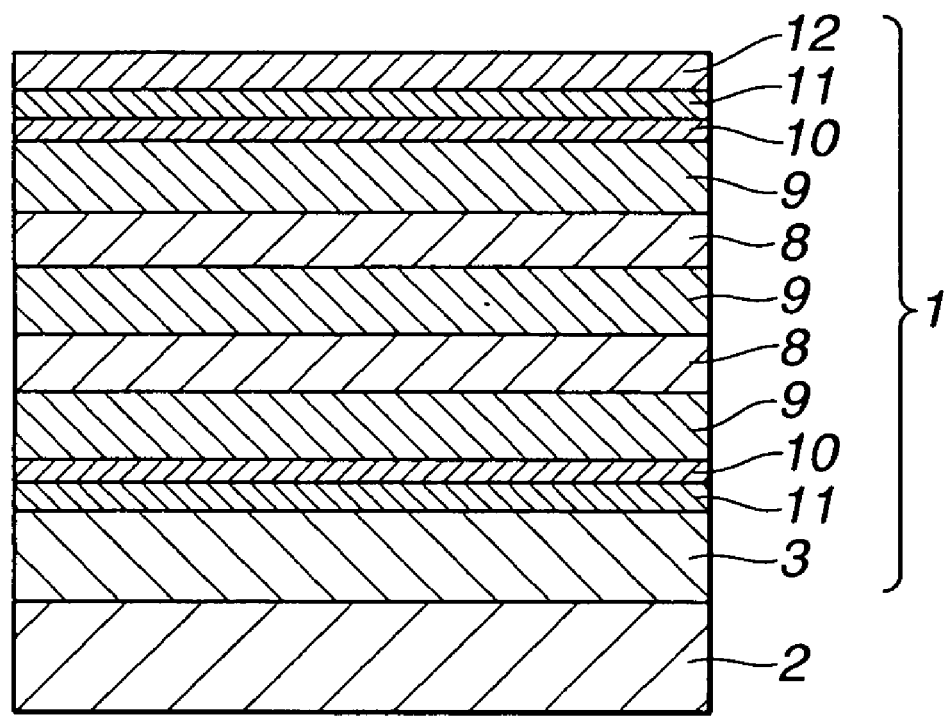
FIG. 3 is a sectional view of a magnetoresistance-effect element of so-called "artificial lattice type," according to the invention.

Moreover, the present invention can provide a spin-valve film of so-called artificial lattice type, i.e., a magnetoresistance-effect element of still another type. FIG. 3 illustrates an artificial lattice type spin-valve film according to the present invention. As shown in FIG. 3, the artificial lattice type spin-valve film 1 comprises a substrate 2, a primary-coat layer 3, an oxide layer 11, a first low-resistance metal layer 10, a first magnetism-sensing layer 9, a first nonmagnetic metal layer 8, a second magnetism-sensing layer 9, a second nonmagnetic metal layer 8, a third magnetism-sensing layer 9, a second low-resistance metal layer 10, an oxide layer 11, and a protective layer 12, which are laid one upon another in the order mentioned. It is desired that the primary-coat layer 3 be made of oxide such as NiO or the like, as will be later explained in detail. Preferably, the magnetism-sensing layers 9 should be made of a CoFe/NiFe/CoFe composite layer. The magnetoresistance-effect element of artificial lattice type, shown in FIG. 3, has three magnetism-sensing layers 9. Nevertheless, the artificial lattice type, magnetoresistance-effect element of the invention is not limited to one with three magnetism-sensing layers. If suffices to incorporate at least two magnetism-sensing layers in the magnetoresistance-effect element of the present invention.

A method of manufacturing the bottom type, spin-valve film 1 shown in FIG. 1 will be described below.

First, the layers that constitute the spin-valve 1 are formed.

More specifically, the substrate 2 is placed in a film-forming apparatus. A primary-coat layer 3, anti-ferromagnetic layer 4, first ferromagnetic layer 5, first nonmagnetic layer 6, second ferromagnetic layer 7, nonmagnetic metal layer 8, magnetism-sensing layer 9, low-resistance metal layer 10, and protective layer 12 made of Ta are formed on the substrate 2, one upon another in the order they are mentioned.

Next, the surface of the protective layer 12 is exposed in an oxygen atmosphere of a pressure lower than the atmospheric pressure. The protective layer 12 is thereby oxidized, forming a layer made of TaO. Oxygen is applied via the protective layer 12, oxidizing the low-resistance metal layer 10 at the surface that does not contact the magnetism-sensing layer 9. The oxide layer 11 is thereby formed.

Since the low-resistance metal layer 10 is oxidized with the oxygen applied through the protective layer 12, the layer 10 would not be oxidized to excess. To state it in other words, it is possible to adjust the thickness of the oxide layer 11 by changing the thickness of the protective layer 12. It suffices if the protective layer 12 has a Ta film which has at least one-atom thickness and which covers the low-resistance metal layer 10. More precisely, the protective layer 12 only needs to have a thickness of 0.28 nm or more.

No protective layer may be laid upon the low-resistance metal layer 10. If this is the case, the surface of the low-resistance metal layer 10 is directly oxidized. Since the metal layer 10 is made of material that can be readily oxidized, such as Cu or the like, it will be oxidized too much, possibly oxidizing the magnetism-sensing layer 9 that functions as free layer. It is desired that the protective layer 12 be 1 nm or less thick. If the protective layer 12 has a thickness exceeding 1 nm, the rate of changing magnetoresistance will decrease in the bottom type, spin-valve film 1.

The oxide layer 11 is formed by processing the low-resistance metal layer 10 in the method described above. The interface between the metal layer 10 and the oxide layer 11 can therefore be very smooth. This suppresses the change in the spin direction of each electron at the interface between the metal layer 10 and the oxide layer 11. Hence, the bottom type spin-valve film 1 capable of causing mirror reflection can be manufactured without lowering the rate of changing magnetoresistance.

In particular, the protective layer 12 can prevent the low-resistance metal layer 10 from being oxidized to excess, because oxygen is applied through the protective layer 12 to oxidize the low-resistance metal layer 10.

A method of manufacturing the top type, spin-valve film 1 shown in FIG. 2 will be now described.

At first, the layers that constitute the top type spin-valve 1 are formed.

More specifically, the substrate 2 is placed in a film-forming apparatus. A primary-coat layer 3, low-resistance metal layer 10, magnetism-sensing layer 9, nonmagnetic metal layer 8, pinned layer 13, anti-ferromagnetic layer 4 and protective layer 12 are formed on the substrate 2, one upon another in the order they are mentioned. It should be noted that the pinned layer 13 is composed of second ferromagnetic layer 7, first nonmagnetic layer 6 and first ferromagnetic layer 5.

It is desired that the primary-coat layer 3 be made of oxide such as NiO or the like.

The resultant structure is subjected to heat treatment. The oxygen the primary-coat layer 3 contains diffuses into that surface of the low-resistance metal layer 10 which faces away from the magnetism-sensing layer 9. As a result, an oxide layer 11 is formed between the primary-coat layer 3 and the low-resistance metal layer 10.

As has been explained, the oxide film 11 is formed by processing the low-resistance metal layer 10 in the present method. The interface between the metal layer 10 and the oxide layer 11 can therefore be very smooth. This suppresses the change in the spin direction of each electron at the interface between the metal layer 10 and the oxide layer 11. Hence, the top type spin-valve film 1 capable of causing mirror reflection can be manufactured without lowering the rate of changing magnetoresistance.

As indicated above, the primary-coat layer 3 that is made of an oxide contacts that surface of the metal layer 10 which faces away from the magnetism-sensing layer 9. The oxygen contained in the primary-coat layer 3 diffuses into that surface, thus oxidizing that surface of the metal layer 10 and forming the oxide layer 11. Alternatively, the oxide layer 11 may be formed directly on the substrate 3, the low-resistance metal layer 10 may be formed on the oxide layer 11, and the magnetism-sensing layers 9 may be formed on the metal layer 10.

A method of manufacturing the spin-valve film 1 of artificial lattice type, shown in FIG. 3, will be described below.

First, the layers that constitute the spin-valve 1 of artificial lattice type are formed.

To be more specific, the substrate 2 is placed in a film-forming apparatus. A primary-coat layer 3, first low-resistance metal layer 10, nonmagnetic metal layers 8, magnetism-sensing layers 9, second low-resistance metal layer 10 and protective layer 12 are formed on the substrate 2, one upon another in the order they are mentioned. More precisely, the nonmagnetic metal layers 8 and magnetism-sensing layers 9 are alternately arranged, one upon another.

It is desired that the primary-coat layer 3 be made of oxide such as NiO or the like.

Next, the oxygen contained in the primary-coat layer 3 is made to diffuse, oxidizing that surface of the first low-resistance metal layer 10 which faces away from the first magnetism-sensing layer 9. A first oxide layer 11 is thereby formed between the primary-coat layer 3 and the first low-resistance metal layer 10.

The surface of the protective layer 12 is exposed in an oxygen atmosphere of a pressure lower than the atmospheric pressure. The protective layer 12 is thereby oxidized, forming a layer made of TaO. Further, oxygen is applied via the protective layer 12, oxidizing the second low-resistance metal layer 10 at the surface that does not contact the third magnetism-sensing layer 9. A second oxide layer 11 is thereby formed between the protective layer 12 and the second low-resistance metal layer 10.

In this method, the first and second oxide layers 11 that cause mirror reflection are formed by processing the first and second low-resistance metal layers 10. The method can therefore manufacture a magnetoresistance-effect element of artificial lattice type in which the interface between each low-resistance metal layer 10 and each oxide layer 11 is extremely smooth. Since oxygen is applied through the protective layer 12 to oxidize the second metal layer 10, the protective layer 12 prevents the layer 10 from being oxidized to excess. Moreover, the protective layer 12 protects the second oxide layer 11 and the other layers provided beneath the second oxide layer 11 after the protective layer 12 has been oxidized.

The layers constituting the spin-valve film 1 of any type mentioned above can be formed by various methods such as sputtering, vapor deposition and any other film-forming process.

As described above, the protective layer 12 and the low-resistance metal layer 10 are oxidized as they are exposed in an oxygen atmosphere of a pressure lower than the atmospheric pressure. The method of oxidizing the layers 12 and 10 is not limited to this in the present invention. Instead, the layers 12 and 10 may be oxidized in the atmosphere. Still alternatively, they may be oxidized a plasma oxidation such as ECR (Electron Cyclotron Resonance) process or ICP (Inductively Coupled Plasma) process.

A magnetoresistance-effect magnetic head according to this invention will be described. The magnetic head is a composite type that comprises an MR head that has a bottom type spin-valve 1 of the type shown in FIG. 1. The composite-type magnetic head is designed for use in hard disk drives.

Figure 4:
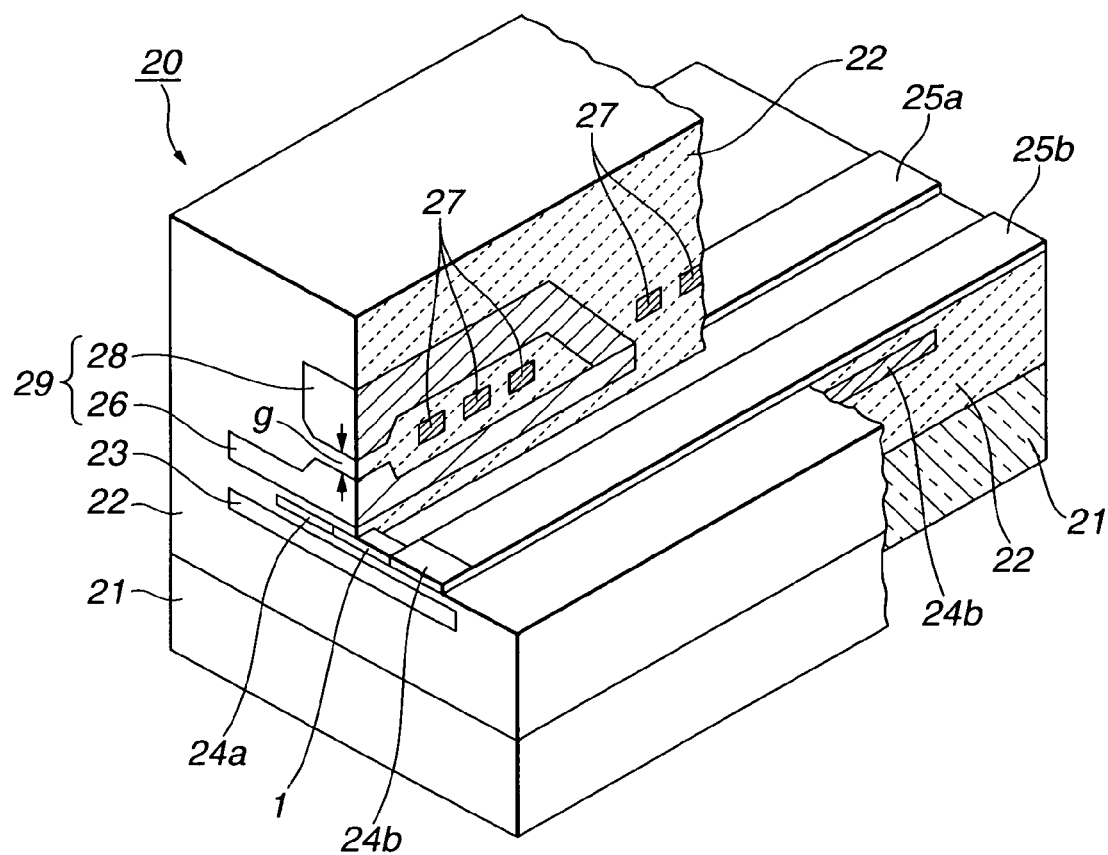
FIG. 4 is a partly sectional, perspective view of an MR head having the spin-valve film shown in FIG. 1.

As shown in FIG. 4, the composite-type magnetic head 20 comprises an MR head and an inductive magnetic head. The inductive magnetic head is mounted on the MR head. The MR head is used as data-reproducing head, while the inductive magnetic head is used as data-recording head.

The MR head will be described first.

The MR head comprises a substrate 21, an insulating layer 22, and a first magnetic shield layer 23. The insulating layer 22 is provided on the substrate 21, and the first magnetic shield layer 23 is provided on the insulating layer 22. The MR head further comprises a spin-valve film 1, bias layers 24a and 24b, connection terminals 25a and 25b, and a second magnetic shield layer 26. The bias layers 24a and 24b are formed on the first magnetic shield layer 23 and extend in the lengthwise direction thereof. The connection terminals 25a and 25b are provided on the first magnetic shield layer 23 and electrically connected to the bias layers 24a and 24b, respectively. The second magnetic shield layer 26 is provided on the bias layers 24a and 24b and connection terminals 25a and 25b.

The substrate 21 is made of hard nonmagnetic material. Examples of the hard nonmagnetic material are alumina titanium carbide (known as "altic") and the like. One side of the substrate 21 is an ABS (Air Bearing Surface) that opposes a disk-shaped recording medium while the composite-type magnetic head 20 is operating.

The insulating layer 22 is made of electrically insulating material. Examples of the insulating material are $Al_2O_3$, $SiO_4$ and the like. In practice, the insulating layer 22 is composed of a plurality of insulating layers that are laid one upon another, though not illustrated in FIG. 4.

The first magnetic shield layer 23 and the second magnetic shield layer 26 prevent that part of the magnetic field emanating from a magnetic recording medium which does not represent signals, from being applied to the spin-valve film 1. That is, the shield layers 23 and 26 attract that part of the magnetic field and guide the other part of the magnetic field, representing the signals to be reproduced, to the spin-valve film 1. This helps to enhance the high-frequency characteristic and read resolution of the spin-valve film 1. The second magnetic shield layer 26 works as the lower-layer core of the inductive magnetic head, too, as will be described later.

The first magnetic shield layer 23 and the second magnetic shield layer 26 are made of soft magnetic material. Examples of the soft magnetic material are sendust (Fe—Al—Si alloy), FeTa, Co-based amorphous material and the like. Alternatively, the magnetic shield layers 23 and 26 may be a composite layer each. For example, each magnetic shield layer may be composed of at least two magnetic thin films, soft-magnetic thin film, and nonmagnetic thin films. The soft-magnetic thin films and the nonmagnetic thin films are alternately deposited one upon another, and the soft-magnetic thin films are made of, for example, Co-based amorphous material.

The spin-valve 1 is a component for detecting the signal magnetic field that emanates from a magnetic recording medium. As has been described, the spin-valve film 1 comprises the primary-coat layer 3, anti-ferromagnetic layer 4, first ferromagnetic layer 5, first nonmagnetic layer 6, second ferromagnetic layer 7, nonmagnetic metal layer 8, magnetism-sensing (free) layer 9, low-resistance metal layer 10, oxide layer 11 and protective layer 12, which are laid one upon another in the order mentioned. In FIG. 4, however, these layers 3 to 12 are not illustrated.

As indicated above, the oxide layer 11 of the spin-valve film 1 has been formed by oxidizing that surface of the low-resistance metal layer 10 which faces away from the magnetism-sensing layer 9. Further, the oxide layer 11 is spaced apart from the magnetism-sensing layer 9 that functions as free layer. Therefore, the magnetism-sensing layer 9 is not oxidized and can maintain its good soft magnetic property. Since the interface between the low-resistance metal layer 10 and the oxide layer 11 is very smooth as described above, the decrease in the rate of changing the magnetoresistance, which results from the changes in the spin directions of electrons, can be reduced to minimum. Therefore, the spin-valve film 1 can attain a high rate of changing magnetoresistance owing to mirror reflection, and the magnetism-sensing layer 9 functioning as free layer can preserve its good soft magnetic property.

Having the spin-valve 1 that excels in both soft magnetic property and rate of changing magnetoresistance, the MR head 20 exhibits high sensitivity to the magnetic field emanating from the magnetic recording medium and can therefore reproduce high-level signals from the magnetic field.

A pair of bias layers 24a and 24b apply bias magnetic fields to the spin-valve film 1, thereby to make the ferromagnetic layers of in the film 1 to provide a single magnetic domain. The bias layers 24a and 24b performs another function of supplying a recording current to the spin-valve film 1. The bias layers 24a and 24b are electrically and magnetically connected to the ends of the spin-valve film 1, respectively.

The bias layers 24a and 24b are made of hard magnetic material and provided at the ends of the spin-valve film 1. Examples of the hard magnetic are CoNiPt, CoCrPt and the like. Electrode layers may be formed on the bias layers 24a and 24b.

The connection terminals 25a and 25b supplies sense current to the bias layers 24a and 24b. The terminals 25a and 25b are thin strips made of a metal that is electrically conductive and has low resistivity. Examples of the metal are Cr, Ta, Ti, W, Mo, Cu and the like.

The inductive magnetic bead will now be described.

The inductive magnetic head comprises a thin-film coil 27 and an upper core 28. The thin-film core 27 is embedded in the insulating layer 22 and arranged above the second magnetic shield layer 26. The insulating layer 22 surrounds the thin-film coil 27. The upper core 28 is provided above the insulating layer 22 that embeds the thin-film coil 27. The second magnetic shield layer 26 and the upper core 28 constitute an magnetic core 29.

The thin-film coil 27 receives an electric current from external connection terminals (not shown). The coil 27 records data on the magnetic recording medium in accordance with changes in the electric current. The thin-film coil 27 is formed by coiling around the magnetic core 29. The thin-film coil 27 has its both ends exposed outside. The ends of the coil 27 are connected to the external connection terminals. The thin-film coil 27 is made of electrically conductive material such as copper.

The upper core 28 defines a closed circuit, along with the second magnetic shield layer 26, and therefore works as the magnetic core 29 of the inductive magnetic head. The upper core 28 and the second magnetic shield layer 26 have their front ends exposed to the ABS (Air Bearing Surface). The upper core 28 and the shield layer 26 are set apart from each other by a predetermined distance g at the front end and contact each other at the rear end. The distance g is the recording gap of the inductive magnetic head 23. The upper core 28 is made of soft magnetic material such as NiFe or the like.

As may be understood from the foregoing, the MR head has the spin-valve film 1 that exhibits both soft magnetic property and high rate of changing the magnetoresistance. Thus, the MR head is sufficiently sensitive to the magnetic field emanating from the magnetic recording medium and can reproduce high-level signals from the magnetic field. The MR head is, therefore, fit for reproducing signals recorded at high density.

The MR head described above incorporates the spin-valve film 1 of bottom type that is illustrated in FIG. 1. The present invention is not limited to an MR head having a bottom type, spin-valve film. Rather, the invention may be applied to an MR head having the top type, spin-valve film 1 shown in FIG. 2 or the artificial lattice, spin-valve film 1 illustrated in FIG. 3.

As seen from the above description, the magnetoresistance-effect element according to this invention has the oxide layer 11 and can therefore cause mirror reflection of electrons. The oxide layer 11 has been formed by oxidizing that surface of the low-resistance metal layer 10 which faces away from the magnetism-sensing layer 9. Further, the oxide layer 11 is spaced apart from the magnetism-sensing layer 9 that functions as free layer. This enables the magnetism-sensing layer 9 (i.e., free layer) to maintain its soft magnetic property. Moreover, the loss of the rate of changing magnetoresistance, resulting from the changes in the spin directions of electrons, can be minimized because the interface between the low-resistance metal layer 10 and the oxide layer 11 is extremely smooth. In the magnetoresistance-effect element of the present invention, the rate of changing magnetoresistance can be increased, without sacrificing the soft magnetic property of the magnetism-sensing layer. Therefore, the magnetoresistance-effect element has high sensitivity to external magnetic fields.

As indicated above, the oxide layer 11 provided in the magnetoresistance-effect element has been formed by that surface of the low-resistance metal layer 10 which faces away from the magnetism-sensing layer 9. This renders the interface between the layers 9 and 10 very smooth. As a result, the changes in the changes in the spin directions of electrons are suppressed in the magnetoresistance-effect element. The magnetoresistance-effect element therefore attains a high rate of changing magnetoresistance.

In particular, the oxide layer 11 can be formed to have an appropriate thickness, because oxygen is applied to the metal layer 10 through the protective layer 12, not directly to the metal layer 10, thus oxidizing the surface of the low-resistance metal layer 10. This helps to manufacture a magnetoresistance-effect element having a high rate of changing magnetoresistance, without deteriorating the soft magnetic property of the magnetism-sensing layer 9 that functions as free layer.

The MR head according to this invention has high sensitivity to the magnetic field emanating from a magnetic recording medium since it comprises a magnetoresistance-effect element that exhibits such good characteristics as set forth above. Thus, the MR head can reproduce high-level signals from the magnetic field. The MR head is suitable for reproducing signals recorded at high density.

Some examples of the spin-valve film 1 described above were made on the experimental basis, each having a low-resistance metal layer made of Cu. The total thickness of the metal layer and the oxide layer incorporated in each example was studied to determine the lower limit, and the relation between the total thickness and the rate of changing magnetoresistance was reviewed.

EXAMPLE 1

First, a Ta layer, NiFe layer, PtMn layer, CoFe layer, Ru layer, CoFe layer, Cu layer, CoFe layer were formed on a glass substrate, one upon another in the order they are mentioned. The Ta layer formed on the glass substrate was 5 nm thick. The NiFe layer and the PtMn layer were 2 nm thick and 20 nm thick, respectively. The CoFe layer formed on the PtMn layer was 1.1 nm thick. The Ru layer had a thickness of 0.8 nm. The CoFe layer provided on the Ru layer was 2.2 nm thick. The Cu layer, the CoFe layer, and the Ta layer were 2.8 nm thick, 2.5 nm thick and 1 nm thick, respectively. The thickness of the Cu layer provided the upper Ta layer was changed to various values ranging from 0 nm to 1 nm, thus preparing several types of thin films.

The Ta layer of each thin film was exposed to the atmosphere, thus applying the oxygen in the atmosphere through the Ta layer to the Cu layer. The surface of the Cu layer is thereby oxidized, forming a CuO layer. The thickness of the Cu layer not oxidized yet was equal to the total thickness of the Cu layer oxidized and the CuO layer formed by the oxidation. Hereinafter, the total thickness will be referred to as "thickness of Cu layer formed."

Thereafter, the resultant structure was heated at 265° C. for four hours, thereby changing the PtMn layer to an ordered-form metal layer. A spin-valve film was thereby obtained.

Thus, several types of spin-valve films were examined for coercive force. The relation between the thickness of the Cu layer formed and the coercive force of the spin-valve film was recorded. Moreover, the spin-valve films were tested for the rate of changing magnetoresistance.

Figure 5:
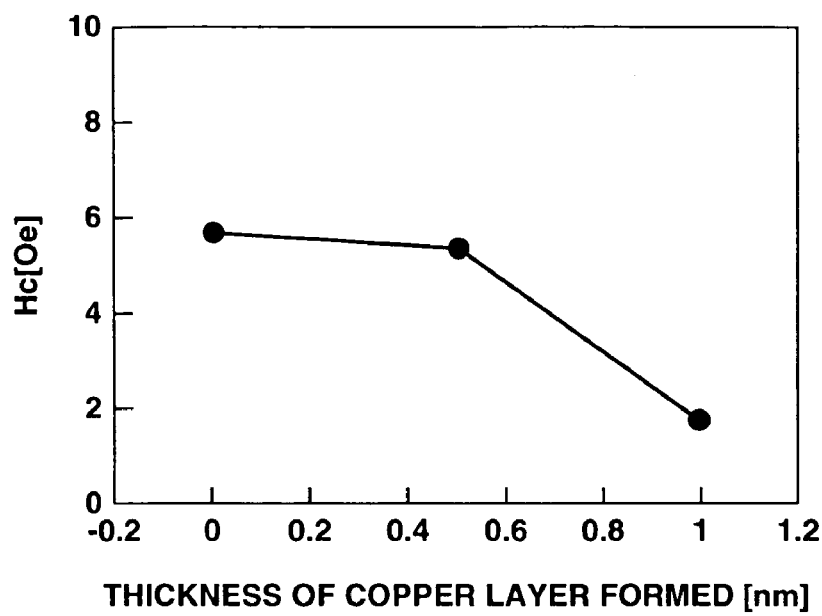
FIG. 5 is a diagram representing the relation between the thickness of the Cu layer formed and the coercive force the entire film exhibits.
Figure 6:
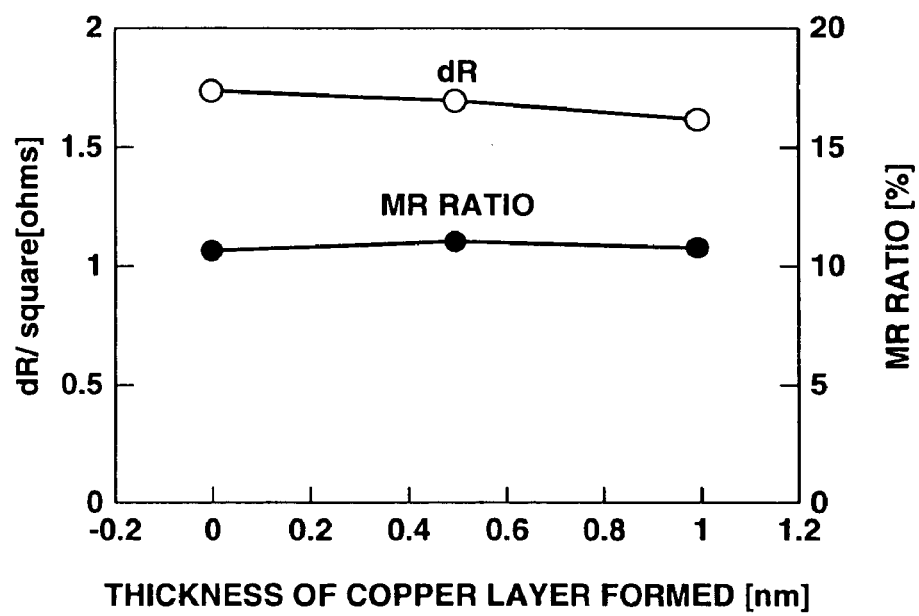
FIG. 6 is a diagram illustrating the relation between the thickness of the Cu layer formed and the magnetoresistance and also the relation between the thickness of the Cu layer and the rate of changing magnetoresistance.

FIG. 5 shows the relation between the thickness of the Cu layer formed and the coercive force, which was observed in each spin-valve film. FIG. 6 shows the relation between the thickness of the Cu layer formed and the magnetoresistance. FIG. 6 also represents the relation between the thickness of the Cu layer and the rate of changing magnetoresistance.

As seen from FIG. 5, the spin-valve film had a small coercive force and maintained soft magnetic property if the Cu layer formed was 0.5 nm or more thick. If the thickness of the Cu layer formed was less than 0.5 nm, however, the CoFe layer, i.e., free layer, was oxidized to acquire a coercive force. As clearly understood from FIG. 6, both the change of magnetoresistance and the rate of changing magnetoresistance were very small even if the Cu layer formed was as thick as 1 nm. This means that the magnetoresistance effect resulting from mirror reflection was not deteriorated. Thus, the spin-valve of the invention can attain both soft magnetic property and high rate of changing magnetoresistance if the Cu layer formed have a thickness of 0.5 nm or more.

The thickness of Cu layer formed (i.e., the total thickness of the Cu layer oxidized and the CuO layer formed by the oxidation) was studied to determine the upper limit of the thickness of the Cu layer formed, in conjunction with the rate of changing magnetoresistance.

EXAMPLE 2

First, a Ta layer, NiFe layer and PtMn layer were formed in the order mentioned, on a glass substrate by means of sputtering or the like. The Ta layer, the NiFe layer and the PtMn layer were 5 nm thick, 2 nm thick and 20 nm thick, respectively.

Next, a CoFe layer was formed on the PtMn layer, and a Ru layer was formed on the CoFe layer, by means of sputtering or the like. The CoFe layer and the Ru layer were 1.1 nm thick and 0.8 nm thick, respectively.

The Ru layer was exposed to the atmosphere and thereby oxidized at one surface, forming a Ru—O layer.

A CoFe layer, Cu layer, CoFe layer, Cu layer and Ta layer were formed on the Ru—O layer, in the order mentioned and one upon another, by means of sputtering or the like. A spin-valve film was thereby provided. The CoFe layer formed on the Ru—O layer was 2.2 nm thick. The Cu layer formed between the CoFe layers was 2.2 nm thick. The CoFe layer formed on the Cu layer was 2.5 nm thick. The Ta layer formed on the second Cu layer was 1 nm thick. The thickness of the Cu layer that contacted the upper Ta layer was changed to various values ranging from 0.5 nm to 1.5 nm, thus preparing several types of thin films.

The Ta layer of each thin film was exposed to the atmosphere, thus applying the oxygen in the atmosphere through the Ta layer to the Cu layer. The surface of the Cu layer is thereby oxidized, forming a CuO layer.

Thereafter, the resultant structure was heated at 265° C. for four hours, thereby changing the PtMn layer to an ordered-form metal layer. A spin-valve film was thereby obtained.

The several types of spin-valve films, which differed in the thickness of the Cu layer, were examined for changes in magnetoresistance. The rate of changing magnetoresistance of each spin-valve film was then calculated.

Figure 7:
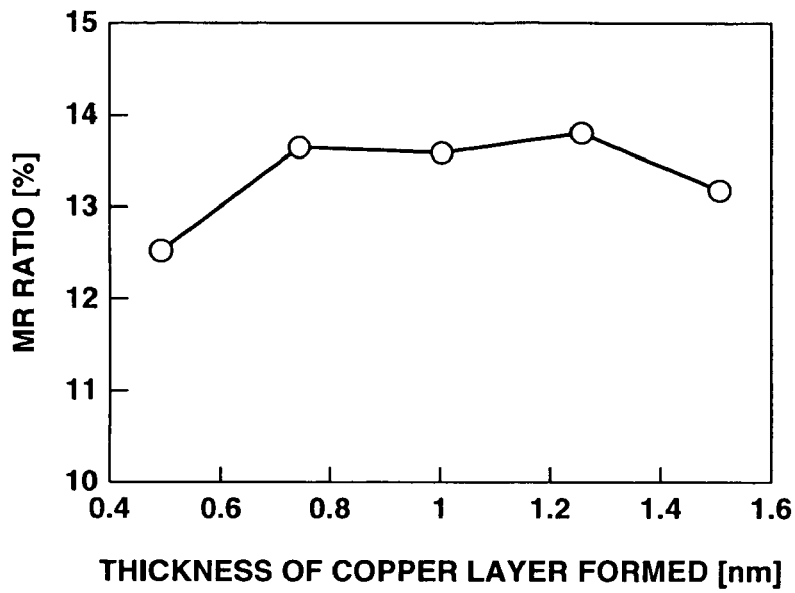
FIG. 7 is a diagram depicting the relation between the thickness of the Cu layer formed and the rate of changing magnetoresistance.

FIG. 7 shows the relation between the thickness of the Cu layer formed and the rate of changing magnetoresistance, which was observed in each spin-valve film.

As is evident from FIG. 7, the spin-valve film had a high rate of changing magnetoresistance if the Cu layer formed was 1.5 nm or less thick. If the thickness of the Cu layer exceeded 1.5 nm, the rate of changing magnetoresistance began to decrease. This means that the upper limit of the thickness of the Cu layer formed is 1.5 nm. The spin-valve film can attain a high rate of changing magnetoresistance as long as the Cu layer formed is 1.5 nm or less thick.

The thickness of the protective layer, through which oxygen was applied to oxidize the Cu layer, was studied.

EXAMPLE 3

First, a Ta layer, NiFe layer and PtMn layer were formed on a glass substrate by sputtering or the like, one laid upon another in the order they are mentioned. The Ta layer, the NiFe layer and the PtMn layer were 5 nm thick, 2 nm thick and 20 nm thick, respectively.

Next, a CoFe layer was formed on the PtMn layer and a Ru layer was formed on the CoFe layer, by means of sputtering or the like. The CoFe layer and the Ru layer were 1.1 nm thick and 0.8 nm thick, respectively.

The Ru layer was exposed to the atmosphere and thereby oxidized at one surface, forming a Ru—O layer.

A CoFe layer, Cu layer, CoFe layer, Cu layer and Ta layer were formed on the Ru—O layer, in the order mentioned and one upon another, by means of sputtering or the like. A spin-valve film was thereby provided. The CoFe layer formed on the Ru—O layer was 2.2 nm thick. The Cu layer formed between the CoFe layers was 2.2 nm thick. The CoFe layer formed on the Cu layer was 2.5 nm thick. The second Cu layer was 1 nm thick. The thickness of the Ta layer that contacted the second Cu layer was changed to various values falling within the range shown in FIG. 8, thereby preparing several types of thin films.

The Ta layer of each thin film was exposed to the atmosphere, thus applying the oxygen in the atmosphere through the Ta layer to the Cu layer. The surface of the Cu layer is thereby oxidized, forming a CuO layer.

Thereafter, the resultant structure was heated at 265° C. for four hours, thereby changing the PtMn layer to an ordered-form metal layer. A spin-valve film was thereby obtained.

The several types of spin-valve films, which differed in the thickness of the Ta layer, were examined for changes in magnetoresistance. The rate of changing magnetoresistance of each spin-valve film was then calculated.

Figure 8:
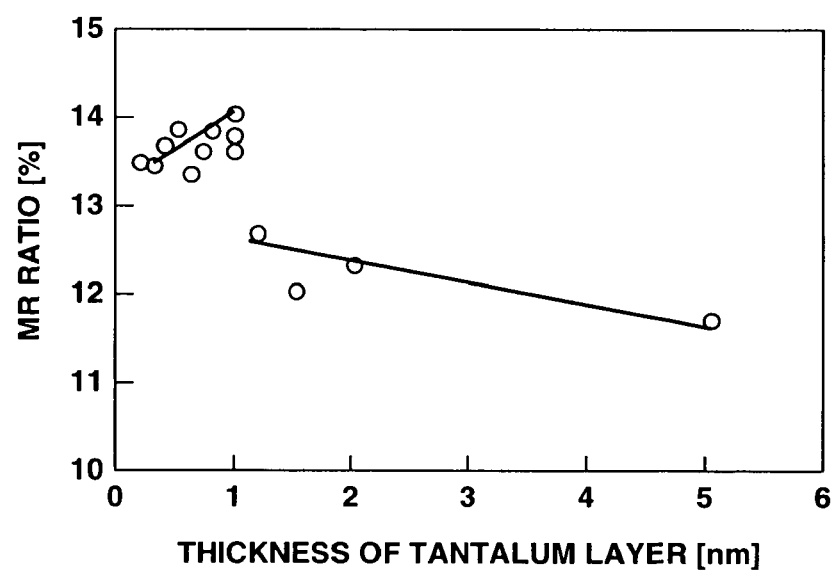
FIG. 8 is a diagram representing the relation the thickness of the Ta layer and the rate of changing magnetoresistance.

FIG. 8 depicts the relation between the thickness of the Ta layer and the rate of changing magnetoresistance, which was observed in each spin-valve film.

As is evident from FIG. 8, the spin-valve film had a high rate of changing magnetoresistance if the Ta layer was 1 nm or less thick. If the thickness of the Ta layer exceeded 1 nm, the rate of changing magnetoresistance decreased greatly. It was found that the upper limit of the thickness of the Ta layer formed should be 1 nm or less.

What is claimed is:

1. A magnetoresistance-effect element comprising:
   a substrate;
   a primary-coat layer formed directly on a surface of the substrate;
   an anti-ferromagnetic layer formed directly on a surface of the primary-coat layer that is opposite the substrate;
   a multilayer pinned layer formed directly on a surface of the anti-ferromagnetic layer that is opposite the primary-coat layer;
   a nonmagnetic metal layer formed directly on a surface of the multilayer pinned layer that is opposite the anti-ferromagnetic layer;
   a magnetism-sensing section the electric resistance of which changes in accordance with an external magnetic field formed directly on a surface of the nonmagnetic metal layer that is opposite the multilayer pinned layer;
   a low-resistance metal layer formed directly on a surface of the magnetism-sensing section that is opposite the nonmagnetic metal layer;
   an oxide layer provided on that surface of the low-resistance metal layer which faces away from the magnetism-sensing section; and
   a non-magnetic protective layer provided on that surface of the oxide layer which faces away from the low-resistance metal layer,
   wherein a total thickness of the low-resistance metal layer and oxide layer ranges from 0.5 nm to 1.5 nm.

2. The magnetoresistance-effect element according to claim 1, wherein the low-resistance metal layer is made of copper.

3. The magnetoresistance-effect element according to claim 1, wherein the oxide layer contains material that oxidizes the element constituting the low-resistance metal layer.

4. The magnetoresistance-effect element according to claim 1, wherein the magnetism-sensing section, the multilayer pinned layer the direction of magnetization of which is fixed by the anti-ferromagnetic layer, and nonmagnetic metal layer interposed between the magnetism-sensing section and the pinned layer constitute a spin-valve film.

5. The magnetoresistance-effect element according to claim 1, wherein a plurality of the magnetism-sensing section and the nonmagnetic metal layer are alternately laid, forming an artificial lattice film, and the low-resistance metal layer contacts the outermost magnetism-sensing section.

6. A magnetoresistance-effect magnetic head comprising:
a substrate;
a pair of magnetic shield members provided on the substrate;
a magnetoresistance-effect element interposed between the magnetic shield members;
a pair of bias layers provided at the ends of longitudinal direction of the magnetoresistance-effect element; and
a pair of lead electrodes provided in the form of thin film and arranged right above the bias layers,
wherein the magnetoresistance-effect element comprises a substrate, a primary-coat layer formed directly on a surface of the substrate, an anti-ferromagnetic layer formed directly on a surface of the primary-coat layer that is opposite the substrate, a multilayer pinned layer formed directly on a surface of the anti-ferromagnetic layer that is opposite the primary-coat layer, a nonmagnetic metal layer formed directly on a surface of the multilayer pinned layer that is opposite the anti-ferromagnetic layer, a magnetism-sensing section the electric resistance of which changes in accordance with an external magnetic field formed directly on a surface of the nonmagnetic metal layer that is opposite the multilayer pinned layer, a low-resistance metal layer formed directly on a surface of the magnetism-sensing section that is opposite the nonmagnetic metal layer, an oxide layer provided on that surface of the low-resistance metal layer which faces away from the magnetism-sensing section, and a non-magnetic protective layer provided on that surface of the oxide layer which faces away from the low-resistance metal layer, wherein a total thickness of the low-resistance metal layer and oxide layer ranges from 0.5 nm to 1.5 nm.

7. The magnetoresistance-effect magnetic head according to claim 6, wherein the low-resistance metal layer is made of copper.

8. The magnetoresistance-effect magnetic head according to claim 6, wherein the oxide layer contains material that oxidizes the element constituting the low-resistance metal layer.

9. The magnetoresistance-effect magnetic head according to claim 6, wherein the magnetism-sensing section, the multilayer pinned layer the direction of magnetization of which is fixed by the anti-ferromagnetic layer, and nonmagnetic metal layer interposed between the magnetism-sensing section and the pinned layer constitute a spin-valve film.

10. The magnetoresistance-effect magnetic head according to claim 6, wherein a plurality of the magnetism-sensing section and the nonmagnetic metal layer are alternately laid, forming an artificial lattice film, and the low-resistance metal layer contacts the outermost magnetism-sensing section.

* * * * *